(12) United States Patent
Hsu

(10) Patent No.: US 6,809,262 B1
(45) Date of Patent: Oct. 26, 2004

(54) FLIP CHIP PACKAGE CARRIER

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/640,953

(22) Filed: Aug. 13, 2003

(30) Foreign Application Priority Data

Jun. 3, 2003 (TW) .................................. 92210189 U

(51) Int. Cl.$^7$ ............................................ H01L 23/28
(52) U.S. Cl. ...................... 174/52.2; 257/738; 257/778; 257/781; 174/52.4
(58) Field of Search ............................... 174/52.2, 52.4, 174/52.1; 257/778, 781, 738, 787

(56) References Cited

U.S. PATENT DOCUMENTS 6,294,840 B1 * 9/2001 McCormick ................ 257/778
2001/0052647 A1 * 12/2001 Plepys et al. ............... 257/738
2002/0153617 A1 * 10/2002 Lee ............................. 257/778
2003/0218250 A1 * 11/2003 Kung et al. ................. 257/737
2004/0099961 A1 * 5/2004 Chu et al. .................... 257/781

* cited by examiner

Primary Examiner—Hung V. Ngo
(74) Attorney, Agent, or Firm—J.C. Patents

(57) ABSTRACT

A flip chip package carrier having a substrate is disclosed. The substrate has a surface with a plurality of bonding pads for connecting with a chip. A solder mask layer covers the substrate. The solder mask layer has a solder mask opening that exposes the bonding pads. Furthermore, a solder layer covers the surface of the bonding pads for increasing the bonding strength between the bonding pads and the conductive bumps in a subsequent flip chip bonding operation. Since the large area solder mask opening completely exposes all the bonding pads, equipment with less alignment precision can be used to form the solder mask layer and its associated solder mask opening. Thus, the cost of producing the flip chip package carrier is lowered and the distance of separation between neighboring bonding pads is reduced.

23 Claims, 3 Drawing Sheets

FLIP CHIP PACKAGE CARRIER

CROSS-REFERENCE TO RELATED APPLICATION

This application claims the priority benefit of Taiwan application serial no. 92210189, filed Jun. 3, 2003.

BACKGROUND OF THE INVENTION

1. Field of the Invention

The present invention generally relates to a chip carrier. More particularly, the present invention relates to a flip chip package carrier for flip chip bonding.

2. Description of the Related Art

With the rapid progress in manufacturing techniques in recent years, many high-tech, personalized and multi-functional electronic products are available in the market. All these products are designed to be light, portable and compact. In the semiconductor industry, chip carrier is a commonly used packaging element. The most common chip carrier mainly comprises a plurality of alternately laid circuit layers and dielectric layers. The dielectric layer is inserted between neighboring patterned circuit layers. By plating a through hole (PTH) or a via, the patterned circuit layers are electrically interconnected. Since the chip carrier has a dense and compact circuit layout and good electrical performance, it has become the principle substrate for forming a flip chip package.

In most flip chip package, the chip is electrically connected to a substrate in a flip chip bonding operation. In general, one of the substrate surfaces has a plurality of bonding pads thereon for bonding with various conductive bumps. The copper bonding pads are actually portions of the outermost patterned circuit layer. Furthermore, a solder mask layer covers the trace lines in the outermost patterned circuit layer. According to whether the bonding pads are covered by a solder mask layer or not, the bonding pads are said to have a 'solder mask defined' (SMD) or a 'non-solder mask defined' (NSMD) configuration.

FIG. 1A is a localized top view of a conventional flip chip package carrier having NSMD bonding pads thereon. FIG. 1B is a cross-sectional view along line I—I of FIG. 1A. As shown in FIGS. 1A and 1B, the flip chip package carrier has a substrate 100 with a surface 102 having a plurality of bonding pads 112a thereon. The bonding pads 112a are actually portions of the outermost patterned circuit layer 110. Furthermore, a patterned solder mask layer 140a covers the surface 102 of the substrate 100 so that the trace lines 114 in the patterned circuit layer 110 is protected. In addition, the patterned solder mask layer 140a has a plurality of solder mask openings 142a that exposes the bonding pads 112a. Because each solder mask openings 142a of the solder mask layer 140a has an area larger than the bonding pad 112a and exposes the upper and the side surface of the bonding pad 112a, this type of bonding pads 112a is defined as a non-solder mask defined (NSMD) bonding pad.

FIG. 2A is a localized top view of a conventional flip chip package carrier having SMD bonding pads thereon. FIG. 2B is a cross-sectional view along line II—II of FIG. 2A. As shown in FIGS. 2A and 2B, the flip chip package carrier has a substrate 100 with a surface 102 having a plurality of bonding pads 112b thereon. The bonding pads 112b are actually portions of the outermost patterned circuit layer 110. Similarly, a patterned solder mask layer 140b covers the surface 102 of the substrate 100 so that the trace lines 114 in the patterned circuit layer 110 is protected. The patterned solder mask layer 140b has a plurality of solder mask openings 142b that exposes the bonding pads 112b. However, because each solder mask openings 142b of the solder mask layer 140b has an area smaller than the bonding pad 112b and exposes only the upper surface of the bonding pad 112b, this type of bonding pads 112a is defined as a solder mask defined (SMD) bonding pad.

With great advances in the manufacturing technique, the size of each chip is reduced correspondingly. That means, for a high-pin-count flip chip package, distance of separation between the conductive bumps is getting smaller. In other words, the distance separating each bonding pad from its neighboring trace lines must be reduced so that a denser circuit layout and a higher bonding pad density is obtained. Yet, it does not matter if the SMD or the NSMD type of bonding pads is used. If there is to be any reduction in the distance of separation between the bonding pad and its neighboring trace line, equipment with a higher level of alignment accuracy is required to form the solder mask layer and the solder mask openings. The higher alignment accuracy prevents the shifting of the solder mask opening to result in an exposure of a neighboring trace line. If the bonding pad and its neighboring trace line are really exposed by the same solder mask opening due to an excessive misalignment, both the bonding pad and the trace line may come in contact with a conductive bump to cause a short circuit. Yet, using equipment with a high alignment precision to form the solder mask layer and the solder mask openings is likely to incur a high cost for producing the substrate.

SUMMARY OF THE INVENTION

Accordingly, one object of the present invention is to provide a flip chip package carrier whose solder mask layer and solder mask openings can be fabricated using processing equipment having a lower alignment accuracy to reduce production cost.

A second object of this invention is to provide a flip chip package structure having a substrate whose distance of separation between a die pad and its neighboring trace lines is reduced so that the substrate can have a denser circuit layer and a higher bonding pad density.

To achieve these and other advantages and in accordance with the purpose of the invention, as embodied and broadly described herein, the invention provides a flip chip package carrier. The flip chip package carrier comprises a substrate, a patterned circuit layer, a first solder mask layer and a solder layer. The patterned circuit layer is set on the surface of the substrate. Moreover, the substrate has a plurality of bonding pads thereon. The first solder mask layer covers the surface of the substrate but has a first solder mask opening that expose various bonding pads. Furthermore, the solder layer covers the upper and side surfaces of the bonding pads.

This invention also provides a flip chip package structure comprising a substrate and a chip. The substrate has a plurality of bonding pads and a solder mask layer thereon. The solder mask layer has a solder mask opening that exposes various bonding pads. A solder layer covers the upper and side surfaces of the bonding pads. The chip is set up on the substrate. Furthermore, a plurality of conductive bumps structurally and electrically connects the chip with various bonding pads on the substrate.

According to one embodiment of this invention, the solder layer is comprised of a low melting point solder material while the conductive bumps are comprised of a material with a higher melting point.

In this invention, a plurality of bonding pads is exposed through a large area solder mask opening within a solder mask layer fabricated using equipment having a relatively low alignment accuracy level. Hence, the production cost of the flip chip package carrier is greatly reduced. Furthermore, with a layer of low melting point solder material covering both the bonding pads and the exposed trace lines, the distance of separation between a bonding pad and its neighboring trace line can be further reduced to increase circuit and bonding pad density of the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
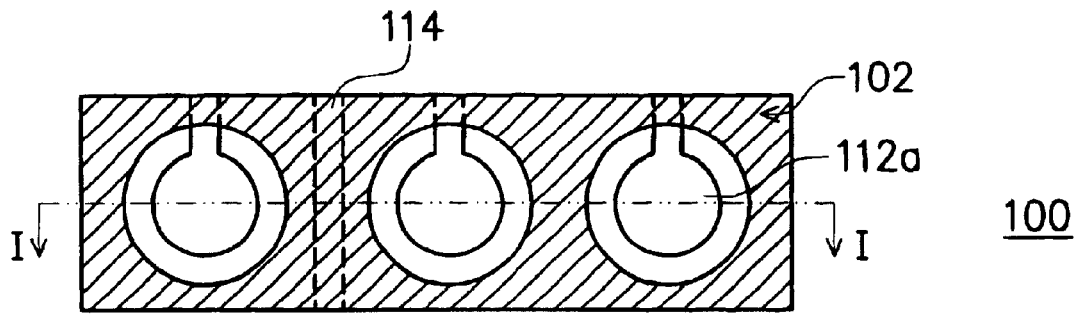
FIG. 1A is a localized top view of a conventional flip chip package carrier having non-solder mask defined (NSMD) bonding pads thereon.
Figure 1B:
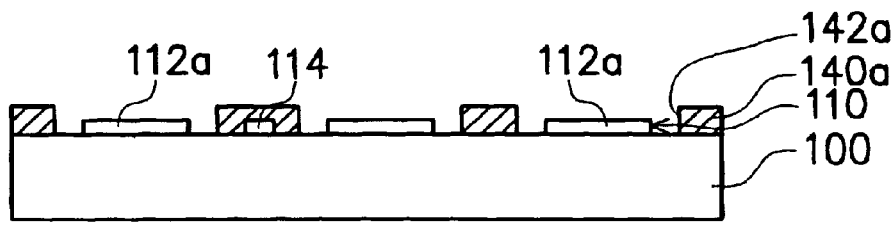
FIG. 1B is a cross-sectional view along line I—I of FIG. 1A.
Figure 2A:
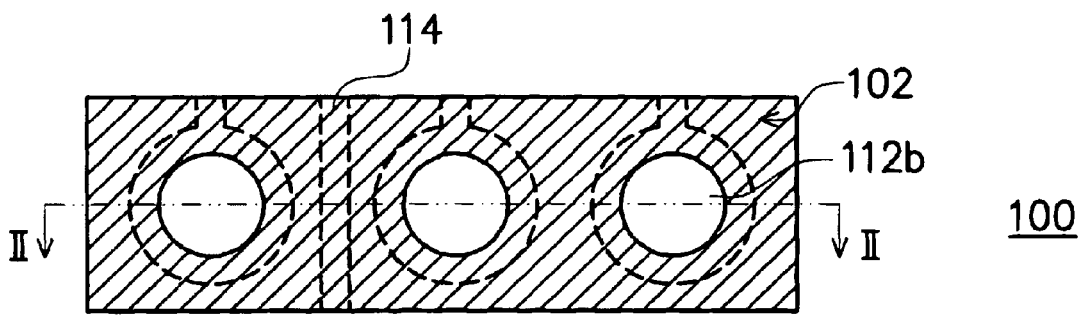
FIG. 2A is a localized top view of a conventional flip chip package carrier having solder mask defined (SMD) bonding pads thereon.
Figure 2B:
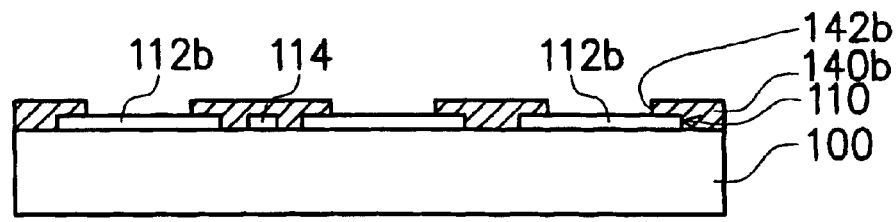
FIG. 2B is a cross-sectional view along line II—II of FIG. 2A.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
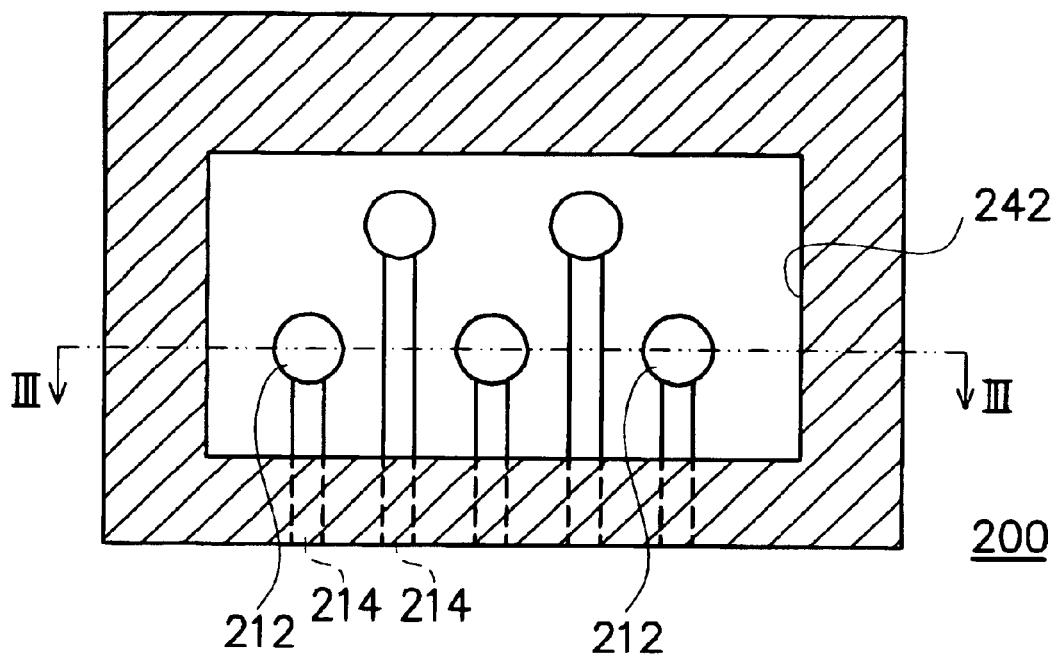
FIG. 3A is a localized top view of a flip chip package carrier according to one preferred embodiment of this invention.
Figure 3B:
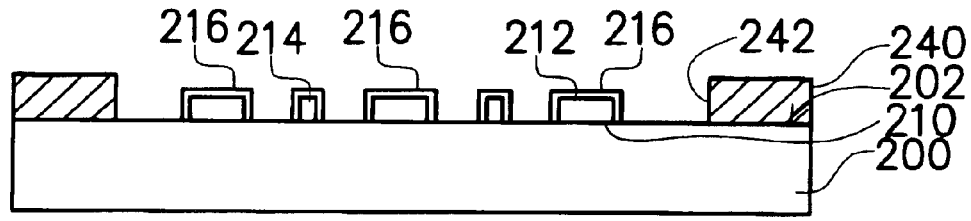
FIG. 3B is a cross-sectional view along line III–III of FIG. 3A.

FIG. 3A is a localized top view of a flip chip package carrier according to one preferred embodiment of this invention. FIG. 3B is a cross-sectional view along line III—III of FIG. 3A. As shown in FIGS. 3A and 3B, the flip chip package carrier comprises a substrate 200 with a surface 202 having a plurality of bonding pads 212 thereon. The bonding pads 212 are actually portions of the outermost patterned circuit layer 210. A solder mask layer 240 covers the surface 202 of the substrate 200. The solder mask layer 240 is used for protecting the trace lines 214 in the outermost patterned circuit layer 210. The solder mask layer 240 has a solder mask opening 242 with an area far greater than the area of the bonding pads 212. Hence, the bonding pads 212 are exposed within a large solder mask opening 242. Since the production of a large area solder mask opening 242 does not require equipment with high alignment precision, overall production cost of the flip chip package carrier 200 is greatly reduced.

As shown in FIG. 3B, a solder layer 216 covers both the upper and side surfaces of the bonding pads 212. The solder layer 216 is comprised of a low melting point material, for example. Through an electroplating operation, solder material is deposited on the upper and side surfaces of the bonding pads 212 to form the solder layer 216. Therefore, The portions of the solder layer 216 respectively on both the upper and side surfaces of the bonding pads 212 are substantially the same thickness. Aside from preventing oxygen in the air from reacting with the bonding pads 212, the solder layer 216 also enhances the bonding capacity (refer to FIG. 4) of the bonding pads 212 with conductive bumps 254 in a subsequent flip chip bonding operation. Furthermore, as shown in FIG. 3A, the trace lines 214 in the outermost patterned circuit layer 210 and the bonding pads 212 are formed together in the same circuit patterning operation, for example. One end of each trace line 214 extends into the solder mask opening 242 and connects with one of the bonding pads 212. Similarly, the solder layer 216 also covers the upper and side surfaces of the trace lines 214 to prevent oxidation, and the portions of the solder layer 216 respectively on both the upper and side surfaces of the trace lines 214 are substantially the same thickness.

To increase circuit layout density, the bonding pads 212 are set as an array within the solder mask opening 242 with the distance of separation between the bonding pad 212 and its neighboring trace line 214 reduced to the width of a single trace line. Obviously, as the area of each bonding pad 212 is reduced or the shape of the bonding pad 212 is changed, the distance separating the bonding pad 212 and its neighboring trace line 214 can be reduced to a width smaller than a single trace line. In other words, the circuit layout and bonding pad density of the flip chip package carrier 200 can be further increased.

Figure 4:
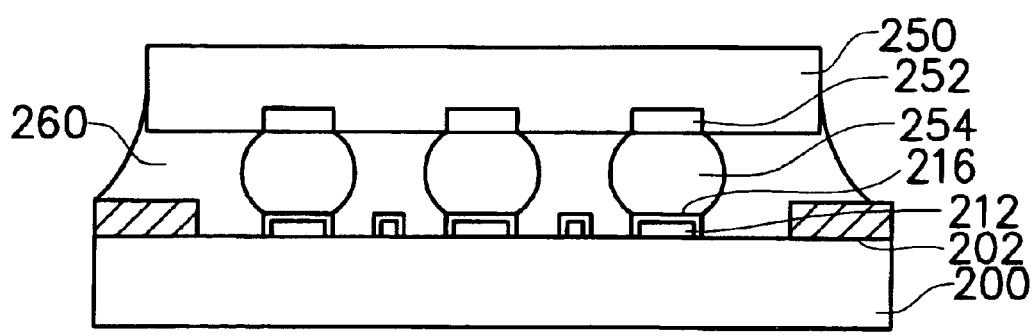
FIG. 4 is a schematic cross-sectional view of an assembled package after a chip is attached to the flip chip package carrier in FIG. 3B.

FIG. 4 is a schematic cross-sectional view of an assembled package after a to chip is attached to the flip chip package carrier in FIG. 3B. A chip 250 is attached to the surface 202 of the substrate 200 in a flip chip bonding process. The chip 250 comprises bonding pads 252 each having a conductive bump 254 thereon. The other ends of the conductive bumps 254 bond with corresponding bonding pads 212 such that the chip 250 and the substrate 200 are both physically and electrically connected via the bumps 254. The surface of the bonding pad 212 has a low melting point solder layer 216. The conductive bumps 254 are comprised of a high melting point material such as lead-tin alloy. The conductive bumps 254 must have a melting point higher than the solder layer 216. Hence, in a reflow process, the solder layer 216 will melt around the bumps 254 to increase the bonding strength between the bump 254 and the bonding pad 212. In addition, an insulating material 260 can be inserted into the space between the chip 250 and the substrate 200 to enclose the conductive bumps 254 and buffer any thermal stress due to a mismatch of the coefficient of thermal expansion between the chip 250 and the substrate 200. The insulating material 260 could be a molding compound or an underfill.

Figure 5:
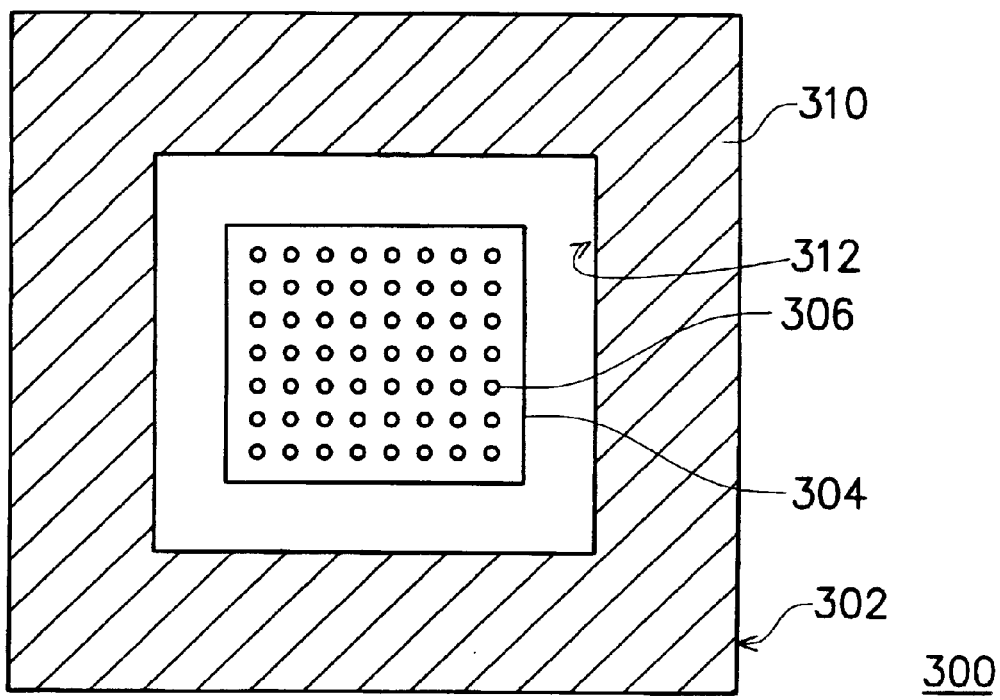
FIGS. 5 and 6 are top views showing the solder mask and the solder mask opening on a flip chip package carrier according to one preferred embodiment of this invention.
Figure 6:
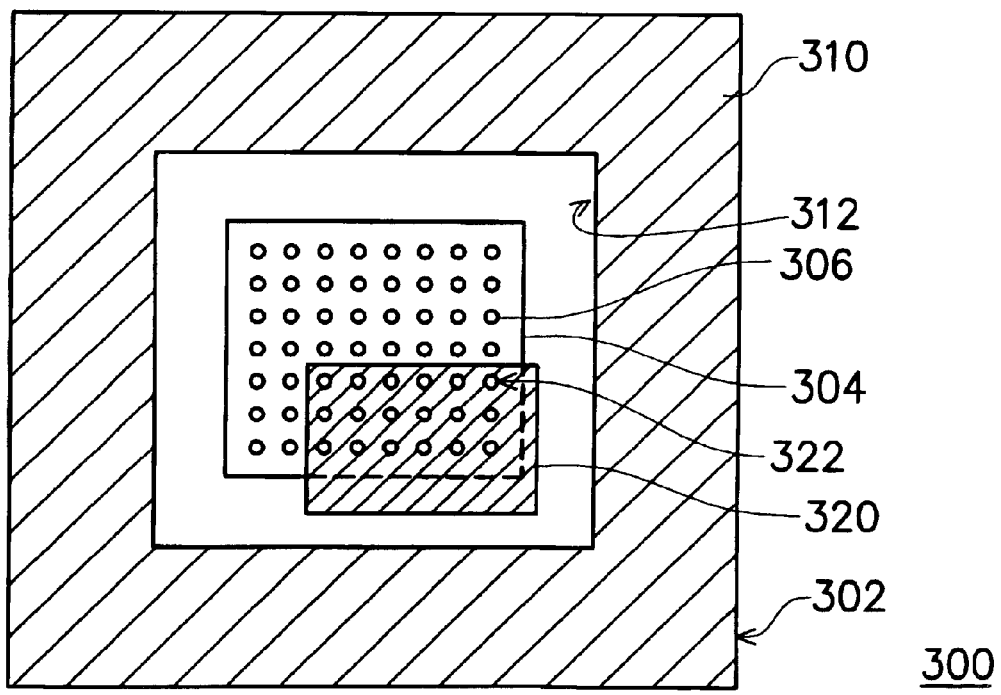

FIGS. 5 and 6 are top views showing the solder mask and the solder mask opening on a flip chip package carrier according to one preferred embodiment of this invention. As shown in FIG. 5, the surface 302 of the substrate 300 has a chip bonding area 304 with an array of bonding pads 306 therein. A solder mask 310 or other solder mask layer covers a portion of the surface 302 of the substrate 300. A solder mask opening 312 is formed outside the chip bonding area 304. The solder mask opening 312 exposes the bonding pads 306. With this design, there is no need to form a plurality of solder mask openings in the chip bonding area 304 of the substrate 300 to expose various bonding pads 306 respectively using equipment with high alignment accuracy. Since only one large single solder mask opening 312 is formed outside the chip bonding area 314, production cost is greatly reduced. Furthermore, a solder material layer (not shown) can be coated on the surface of the bonding pads 306 in an electroplating operation to increase the reliability of flip chip bonding. In some special cases, another solder mask layer 320 may also be formed inside the solder mask opening 312 to cover a portion of the chip bonding area 304 as shown in FIG. 6. The solder mask layer 320 has a plurality of solder mask openings 322 that exposes some of the bonding pads 306 respectively, for example. According to whether the bonding pads 306 are covered by a solder mask or not, the bonding pads 306 are said to have a 'solder mask defined' (SMD) or a 'non-solder mask defined' (NSMD) configuration. In addition, the solder mask layer 320 and the solder mask openings 322 can be fabricated using high precision equipment.

In this invention, a plurality of bonding pads is exposed through a large area solder mask opening within a solder mask layer formed on a substrate. Furthermore, a layer of solder material is plated on the upper and side surface of the bonding pads to enhance the bonding strength between the bonding pads and the conductive bumps in a subsequent flip chip bonding process.

In summary, major advantages of the flip chip package carrier according to this invention includes:

1. Instead of forming a plurality of high precision solder mask openings, only a single large area solder mask opening is formed within the chip bonding area of the substrate. Hence, distance of separation between neighboring bonding pads can be reduced.

2. Equipment having a lower alignment accuracy level can be used to fabricate the solder mask layer and the single large solder mask opening. Thus, overall production cost of the flip chip package carrier is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip package carrier, at least comprising:
   a substrate;
   a patterned circuit layer set on a surface of the substrate, wherein the patterned circuit layer comprises a plurality of bonding pads;
   a first solder mask layer covering the substrate, wherein the first solder mask layer comprises a first solder mask opening that exposes the bonding pads; and
   a solder layer covering both the upper and side surfaces of the bonding pads.

2. The flip chip package carrier of claim 1, wherein the surface of the substrate comprises a chip bonding area in which all the bonding pads located, and the first solder mask opening exposes the chip bonding area.

3. The flip chip package carrier of claim 2, wherein the package further comprises a second solder mask layer covering a portion of the chip bonding area, and the second solder mask layer comprises a plurality of second solder mask openings that exposes some of the bonding pads.

4. The flip chip package carrier of claim 1, wherein the patterned circuit layer further comprises at least a trace line with one end extended into the first solder mask opening and connected to one of the bonding pads, and furthermore, the upper and side surfaces of the trace line not covered by the first solder mask layer are covered with the solder layer.

5. The flip chip package carrier of claim 1, wherein the solder layer is comprised of a metallic material or an alloy material with a low melting point.

6. The flip chip package carrier of claim 1, wherein the solder layer is comprised of a lead-tin alloy.

7. A flip chip package structure, at least comprising:
   a substrate with a surface having a plurality of bonding pads thereon, wherein the surface of the substrate comprises a first solder mask layer, and the first solder mask layer comprises a first solder mask opening that exposes the bonding pads, and a solder layer covers both the upper and side surfaces of the bonding pads;
   a chip set on the substrate; and
   a plurality of conductive bumps physically and electrically connecting the chip to the bonding pads of the substrate.

8. The flip chip package structure of claim 7, wherein the substrate surface comprises at least a trace line with one end extended into the first solder mask opening and connected to one of the bonding pads, and furthermore, the upper and side surfaces of the trace line not covered by the first solder mask layer is covered by the solder layer.

9. The flip chip package structure of claim 7, wherein the substrate surface has a chip bonding area in which all the bonding pads located, and the first solder mask opening exposes the chip bonding area.

10. The flip chip package structure of claim 9, wherein the package further comprises a second solder mask layer set within the first solder mask opening for covering a portion of the chip bonding area, and the second solder mask layer comprises a plurality of second solder mask openings that exposes some of the bonding pads.

11. The flip chip package structure of claim 7, wherein the solder layer is comprised of a metallic or an alloy material with a low melting point.

12. The flip chip package structure of claim 7, wherein the solder layer is comprised a lead-tin alloy.

13. The flip chip package structure of claim 7, wherein the conductive bump has a melting point higher than the solder layer.

14. The flip chip package structure of claim 7, wherein the package further comprises a insulating material in the space between the chip and the substrate and exposing the conductive bumps.

15. A flip chip package carrier, at least comprising:
   a substrate having a chip bonding area;
   a patterned circuit layer set on a surface of the substrate, wherein the patterned circuit layer comprises a plurality of bonding pads and a plurality of trace lines, wherein the bonding pads and a portion of the trace lines are located inside the chip bonding area;
   a first solder mask layer covering the substrate, wherein the first solder mask layer comprises a first solder mask opening that exposes the chip bonding area; and
   a solder layer covering both the upper and side surfaces of the bonding pads and the trace lines not covered by the first solder mask layer.

16. The flip chip package carrier of claim 15, wherein the package further comprises a second solder mask layer covering a portion of the chip bonding area, and the second solder mask layer comprises a plurality of second solder mask openings that exposes some of the bonding pads.

17. The flip chip package carrier of claim 15, wherein the solder layer is comprised of a metallic or an alloy material with a low melting point.

18. The flip chip package carrier of claim 15, wherein the solder layer is comprised of a lead-tin alloy.

19. A flip chip package structure, at least comprising:
a substrate having a chip bonding area;
a patterned circuit layer set on a surface of the substrate, wherein the patterned circuit layer comprises a plurality of bonding pads and a plurality of trace lines and the bonding pads and a portion of the trace lines are located within the chip bonding area;
a first solder mask layer covering the substrate surface, wherein the first solder mask layer comprises a first solder mask opening that exposes the chip bonding area;
a solder layer covering both the upper and side surfaces of the bonding pads and the portion of the trace lines not covered by the first solder mask layer;
a chip set on the substrate; and
a plurality of conductive bumps physically and electrically connecting the chip to the bonding pads on the substrate, wherein the conductive bumps have a melting point higher than the solder layer.

20. The flip chip package structure of claim 19, wherein the package further comprises a second solder mask layer within the first solder mask opening covering a portion of the chip bonding area, and the second solder mask layer comprises a plurality of second solder mask openings that exposes some of the bonding pads.

21. The flip chip package structure of claim 19, wherein the solder layer is comprised of a metallic or an alloy material with a low melting point.

22. The flip chip package structure of claim 19, wherein the solder layer is comprised of a lead-tin alloy.

23. The flip chip package structure of claim 19, wherein the package further comprises a insulating material in the space between the chip and the substrate and exposing the conductive bumps.

* * * * *